(12) United States Patent
Inoue

(10) Patent No.: US 9,312,515 B2
(45) Date of Patent: Apr. 12, 2016

(54) ORGANIC EL DEVICE AND METHOD FOR MANUFACTURING ORGANIC EL DEVICE

(71) Applicant: Sharp Kabushiki Kaisha, Osaka (JP)

(72) Inventor: Satoshi Inoue, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/402,211

(22) PCT Filed: Apr. 19, 2013

(86) PCT No.: PCT/JP2013/061644
§ 371 (c)(1),
(2) Date: Nov. 19, 2014

(87) PCT Pub. No.: WO2013/175913
PCT Pub. Date: Nov. 28, 2013

(65) Prior Publication Data
US 2015/0137085 A1 May 21, 2015

(30) Foreign Application Priority Data

May 22, 2012 (JP) ................................. 2012-116988

(51) Int. Cl.
*H01L 51/52* (2006.01)
*H01L 51/56* (2006.01)
*H01L 27/32* (2006.01)

(52) U.S. Cl.
CPC ........ *H01L 51/5253* (2013.01); *H01L 27/3248* (2013.01); *H01L 27/3258* (2013.01); *H01L 51/525* (2013.01); *H01L 51/56* (2013.01); *H01L 27/3246* (2013.01); *H01L 2227/323* (2013.01)

(58) Field of Classification Search
CPC .......... H01L 27/3244–27/3297; H01L 27/326; H01L 51/5225; H01L 51/5209; H01L 51/5253; H01L 51/56; H01L 51/525; H01L 2227/323
See application file for complete search history.

(56) References Cited

U.S. PATENT DOCUMENTS

| | | | |
|---|---|---|---|
| 2004/0007965 A1* | 1/2004 | Kijima et al. ................. | 313/495 |
| 2005/0082969 A1* | 4/2005 | Tokuda et al. ................ | 313/506 |
| 2005/0247936 A1* | 11/2005 | Bae et al. ........................ | 257/59 |
| 2006/0082292 A1* | 4/2006 | Kang et al. .................... | 313/504 |
| 2007/0052349 A1* | 3/2007 | Giraldo et al. ................ | 313/506 |

(Continued)

FOREIGN PATENT DOCUMENTS

| | | |
|---|---|---|
| JP | 2005-322655 A | 11/2005 |
| JP | 2006-185789 A | 7/2006 |
| JP | 2007-184229 A | 7/2007 |

OTHER PUBLICATIONS

Written Opinion of the International Searching Authority, World Intellectual Property Office, Nov. 22, 2014, all pages.*

*Primary Examiner* — Victoria K Hall
(74) *Attorney, Agent, or Firm* — Chen Yoshimura LLP

(57) ABSTRACT

Provided is an organic EL device having high reliability, wherein decrease of the luminance due to the generation of a gas such as water vapor is suppressed. This organic EL device is provided with: an interlayer insulating film that is formed on a substrate; a lower electrode that is formed above the interlayer insulating film so as to correspond to a light emitting region; a light emitting layer that is formed on the lower electrode in the light emitting region; and an upper electrode that is formed on the light emitting layer. A gap is formed between the interlayer insulating film and the lower electrode.

8 Claims, 6 Drawing Sheets

(56) References Cited

U.S. PATENT DOCUMENTS

| | | | |
|---|---|---|---|
| 2007/0131948 A1* | 6/2007 | Seo et al. | 257/87 |
| 2007/0152570 A1* | 7/2007 | Jung | 313/504 |
| 2009/0315456 A1* | 12/2009 | Furukawa et al. | 313/504 |
| 2011/0175097 A1* | 7/2011 | Song et al. | 257/59 |
| 2011/0316007 A1* | 12/2011 | Sagawa | 257/88 |
| 2012/0181933 A1* | 7/2012 | Ma et al. | 315/121 |
| 2012/0205678 A1* | 8/2012 | Ikeda et al. | 257/88 |

* cited by examiner (a)

(b)

|  | Resin Layer Below Lower Electrode Present (Conventional) | Resin Layer Below Lower Electrode Absent (Present Invention) |
|---|---|---|
| Initial State | | |
| After 200 Hours at Temperature 85°C, Humidity 85% | | |

ORGANIC EL DEVICE AND METHOD FOR MANUFACTURING ORGANIC EL DEVICE

TECHNICAL FIELD

The present invention relates to an organic EL device and to a method of manufacturing an organic EL device.

BACKGROUND ART

In recent years, as displays, non-light emitting liquid crystal displays (LCDs), light-emitting plasma display panels (PDPs), inorganic electroluminescent (inorganic EL) displays, organic electroluminescent (organic EL) displays (see Patent Document 1, etc.), and the like are known. Among these, organic EL displays emit light, have a wide viewing angle, high contrast, high responsiveness, and the like, which are characteristics absent in LCDs, and attention has been particularly paid to such organic EL displays.

Below, a configuration of an organic EL display (organic EL device) will be described with reference to FIG. 9. FIG. 9 is a cross-sectional view showing a schematic configuration of an organic EL device disclosed in Patent Document 1.

As shown in FIG. 9, the organic EL device 100 includes organic EL elements 29 on a semiconductor substrate 3. The semiconductor substrate 3 includes: a glass substrate 100a; scan wiring lines 110 electrically connected to the organic EL elements 29 and formed on the glass substrate 100a; a power source pattern 120 (conductive pattern: power supply line) that supplies power to the organic EL elements 29; a negative pattern 130 (conductive pattern) electrically connected to a negative polarity 250; plated metal 51 and 52 layered on the power source pattern 120 and the negative pattern 130; TFTs 140 (driving elements) that drive the organic EL elements 29; and a first resin film 300 and a second resin film 600.

The organic EL elements 29 include a positive polarity 210 (lower electrode) electrically connected to the TFT 140 formed on the semiconductor substrate 3; a hole injection/transport layer 220; a light-emitting layer 230; an electron injection/transport layer 240; and a negative polarity 250 (upper electrode), and holes formed in the positive polarity 210 and electrons formed in the negative polarity 250 bond in the light-emitting layer 230 to emit light.

RELATED ART DOCUMENT

Patent Document

Patent Document 1: Japanese Patent Application Laid-Open Publication, "Japanese Patent Application Laid-Open Publication No. 2006-185789 (Published on Jul. 13, 2006)"

SUMMARY OF THE INVENTION

Problems to be Solved by the Invention

However, in the conventional organic EL device, if driving is performed to age the organic EL elements, luminance decreases in a few dozen hours, and the pixels darken gradually from the edges (see FIG. 10). This is because, even though degassing is performed where resin layers are formed by substrate heating prior to the formation of the organic EL elements, after the organic EL elements are formed, gas such as water vapor is generated by a resin layer (second resin film 600) below the lower electrode (positive polarity 210) after forming the organic EL elements, and thus, the organic layer (light-emitting layer or the like) above the lower electrode deteriorates.

The present invention takes into account the above-mentioned problem and an object thereof is to provide a highly reliable organic EL device and a method of manufacturing the same by which it is possible to mitigate a decrease in luminance resulting from the generation of gases such as water vapor.

Means for Solving the Problems

In order to solve the above-mentioned problem, an organic electroluminescent device according to the present invention is an organic electroluminescent device having a plurality of pixels each having a light-emitting region therein, including:
  a substrate;
  an insulating layer formed on the substrate;
  a plurality of lower electrodes formed over the insulating layer, respectively in the plurality of light-emitting regions;
  light-emitting layers formed respectively on the lower electrodes in the plurality of light-emitting regions; and
  an upper electrode formed on the light-emitting layers,
  wherein a gap is formed between the insulating layer and the lower electrodes thereover.

In order to solve the above-mentioned problem, a method of manufacturing an organic electroluminescent device according to the present invention is a method of manufacturing organic electroluminescent device having a plurality of pixels each having a light-emitting region therein, including:
  forming a first insulating layer on a substrate;
  forming a second insulating layer on the first insulating layer;
  forming a plurality of lower electrodes on the second insulating layer respectively in the plurality of light-emitting regions;
  forming a third insulating layer on the lower electrodes;
  removing the second insulating layer after forming the third insulating layer;
  forming an organic layer on the third insulating layer after removing the second insulating layer; and
  forming an upper electrode on the organic layer.

Effects of the Invention

The organic EL device and the method of manufacturing an organic EL device of the present invention has a configuration such that a gap is formed between the insulating layer and the lower electrode as described above. As a result, it is possible to provide a highly reliable organic EL device in which a decrease in brightness resulting from the generation of gases such as water vapor is mitigated.

DETAILED DESCRIPTION OF EMBODIMENTS

One embodiment of the present invention will be described below with reference to drawings. An organic electroluminescent (organic EL) device according to the present invention can be applied to various electronic devices such as displays for televisions, displays for mobile phones, and displays for personal computers.

(Cross-Sectional Configuration of Organic EL Device)

Figure 1:
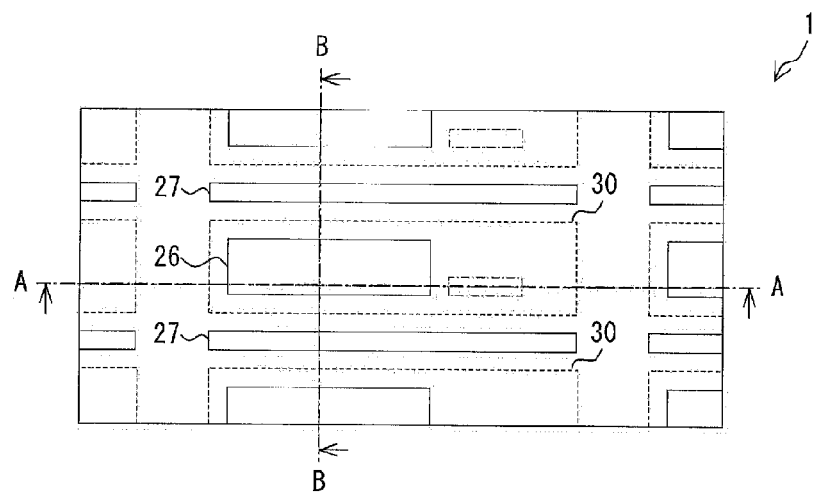
FIG. 1 is a plan view showing a schematic configuration of a main portion of an organic EL device according to the present embodiment.

FIG. 1 is a plan view showing a schematic configuration of a main portion of an organic EL device according to the present embodiment, FIG. 2(a) is a cross-sectional view of FIG. 1 along the line A-A, and FIG. 2(b) is a cross-sectional view of FIG. 1 along the line B-B.

Figure 2:
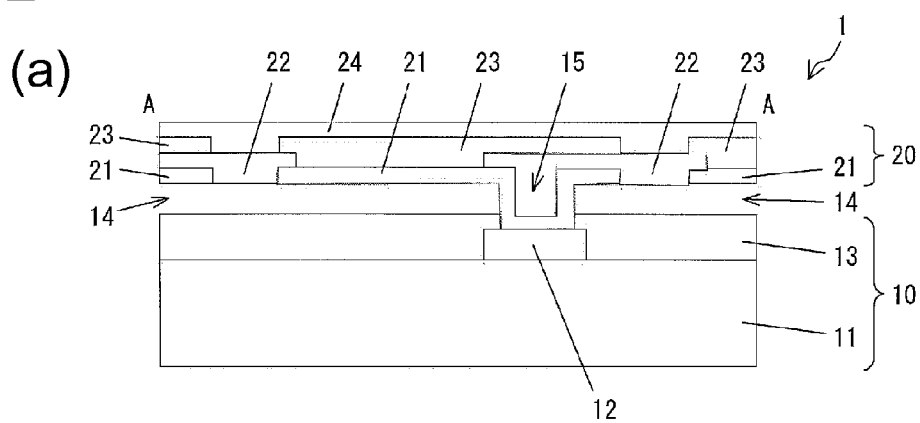
FIG. 2(a) is a cross-sectional view of FIG. 1 along the line A-A.
FIG. 2(b) is a cross-sectional view of FIG. 1 along the line B-B.
Figure 2:
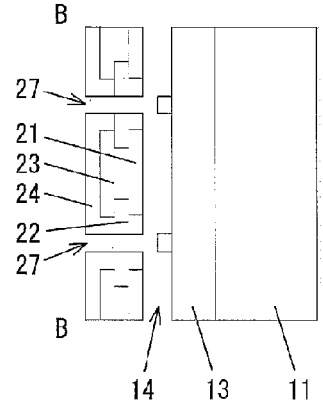

First, the cross-sectional configuration of the organic EL device of the present embodiment will be described with reference to FIG. 2. An organic EL device 1 includes a plurality of organic EL elements 20 arranged in a matrix on a semiconductor substrate 10. FIG. 2 shows one organic EL element.

The semiconductor substrate 10 includes a plurality of TFTs 12, a plurality of signal lines (not shown) for driving the organic EL elements 20, and an interlayer insulating film 13 (first insulating layer) covering the TFTs 12 and the signal lines formed on a glass substrate 11. The insulating substrate of the semiconductor substrate 10 is not limited to being a glass substrate, and may be a plastic substrate made of polyethylene terephthalate, polycarbazole, or polyimide. The TFTs 12 can be made according to known materials and known methods.

The organic EL element 20 includes a lower electrode 21 (positive polarity; pixel electrode), an upper insulating layer 22, an organic layer 23, and an upper electrode 24 (negative polarity).

The lower electrode 21 is formed over the interlayer insulating film 13 across a gap 14 (space) so as to form a pair with a TFT 12. In other words, a gap 14 (space) is formed between the lower electrode 21 and the interlayer insulating film 13. The interlayer insulating film 13 has a contact hole 15 formed therein, and through the contact hole 15, the lower electrode 21, which penetrates the interlayer insulating film 13, and the TFT 12 are electrically connected to each other.

The interlayer insulating film 13 can be formed of a known material (organic or inorganic). As an inorganic material, silicon oxide ($SiO_2$), silicon nitride (SiN or $Si_2N_4$), tantalum oxide (TaO or $Ta_2O_5$), or the like can be used, for example. An acrylic resin, a resist material, or the like can be used as an organic material.

The lower electrode 21 can be formed of a known electrode material having a large work function. The lower electrode 21 can be formed of a metal such as gold (Au), platinum (Pt), and nickel (Ni), or a transparent electrode material such as an oxide (ITO) of indium (In) and tin (Sn), an oxide ($SnO_2$) of tin (Sn), and an oxide (IZO) of indium (In) and zinc (Zn), for example.

An upper insulating layer 22 (third insulating layer) covers edges of the lower electrode 21, and has formed therein an opening 26 in a light-emitting portion (light-emitting region) of each pixel area. The upper insulating layer 22 can be made of an organic material such as an acrylic resin or a resist material.

The organic layer 23 includes a hole transport layer and a light-emitting layer. The hole transport layer is formed on the upper insulating layer 22, and the light-emitting layer is formed on the hole transport layer.

The hole transport layer can be formed of a known material. The hole transport layer can be made of a porphyrin derivative, an aromatic tertiary amine compound, a styrylamine derivative, polyvinyl carbazole, poly-p-phenylenevinylene, polysilane, a triazole derivative, an oxadiazole derivative, an imidazole derivative, a polyaryl alkane derivative, a pyrazoline derivative, a pyrazolone derivative, a fluorenone derivative, hydrogenated amorphous silicon, hydrogenated amorphous silicon carbide, zinc sulfide, or zinc selenide, for example.

The light-emitting layer is made of a material with a high light-emitting efficiency; when a voltage is applied to the lower electrode 21 and an upper electrode 24, the holes and electrons injected from both electrodes are recombined, causing energy deactivation, resulting in light being emitted. Specifically, the light-emitting layer can be made of a metal oxinoid compound (a 8-hydroxyquinoline metal complex), a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a perylene derivative, a perinone derivative, a rhodamine derivative, phenoxazone, a quinacridone derivative, rubrene, poly-p-phenylene vinylene, polysilane, or the like.

The upper electrode 24 (negative polarity) made of an electrode material having a small work function is formed on the entire glass substrate 11 so as to cover the light-emitting layer of the organic layer 23. The upper electrode 24 is formed as one surface on the light-emitting layer to be shared among the plurality of organic EL elements 20.

The upper electrode 24 can be formed of a known electrode material having a small work function. The upper electrode 24 can be formed of a metal such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), or ytterbium (Yb), or an alloy including lithium fluoride (LiF), calcium (Ca), aluminum (Al), or the like.

A sealing substrate (not shown) made of a glass substrate or the like is provided on the upper electrode 24, and the upper electrode 24 and the sealing substrate are bonded to each other by a sealing resin (not shown) coated on the periphery of the sealing substrate. As a result, it is possible to prevent the organic EL elements 20 from being damaged by exposure to oxygen or water.

In the organic EL device 1 of the present embodiment, the lower electrode 21 is the positive polarity and the upper electrode 24 is the negative polarity, but the configuration is not limited thereto; the layering structure can be reversed such that the lower electrode 21 is the negative polarity and the upper electrode is the positive polarity. In this case, the lower electrode 21 (negative polarity), the organic layer 23 (light-emitting layer, hole transport layer), and the upper electrode 24 (positive polarity) would be layered in this order from the bottom, with the materials for the lower electrode 21 and the upper electrode 24 being interchanged. For example, the lower electrode 21 can be the negative pole and made of Al (aluminum), which has a small work function, and the upper electrode 24 can be the positive polarity and made of ITO, which as a large work function. In addition, depending on the characteristics that are sought, it is possible to add, as appropriate, a hole injection layer, an electron transport layer, or an electron injection layer to the layered structure of the organic EL element 20. Also, the hole transport layer can double as a hole injection layer. In this manner, the organic EL element 20 can have various structures.

The organic EL device 1 can have a bottom emission structure in which light is emitted outside from the glass substrate 11 side, a top emission structure in which light is emitted outside from a side opposite to the glass substrate 11, or a double emission structure in which light is emitted from both sides.

(Plan View Configuration of Organic EL Device)

The plan view configuration of the organic EL device of the present embodiment will be described with reference to FIG. 1. As shown in FIG. 1, in the display region of the organic EL device 1, a plurality of gate wiring lines and a plurality of source wiring lines (not shown) are provided so as to intersect each other, and a pixel 30 is formed at each intersection of the gate wiring lines and the source wiring lines.

Each pixel 30 has an organic EL element 20 that emits red light, an organic EL element 20 that emits green light, or an organic EL element 20 that emits blue light, and additionally includes a TFT 12 as a driving element. The gate electrode of the TFT 12 is connected to a gate wiring line, the source electrode is connected to the source wiring line, and the drain electrode is connected to the lower electrode 14 (pixel electrode), and each organic EL element 20 is driven/stopped by the TFT 12 turning ON/OFF.

(Method of Manufacturing Organic EL Device)

Figure 3:
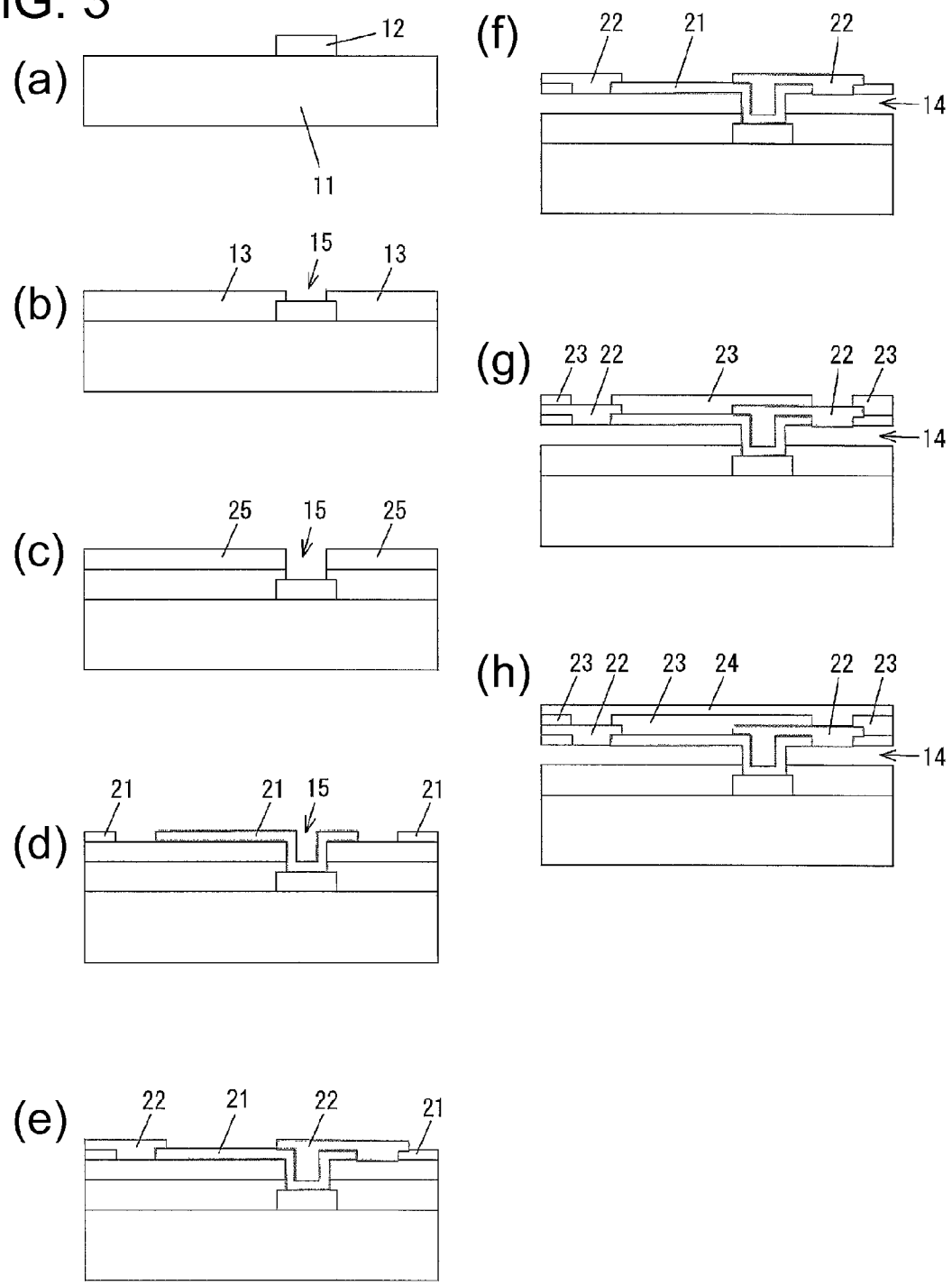
FIGS. 3(a) to 3(h) are cross-sectional views for describing a method of manufacturing the organic EL device of the present embodiment.

A method of manufacturing the organic EL device of the present embodiment will be described with reference to FIG. 3. FIGS. 3(a) to 3(h) are cross-sectional views for describing a method of manufacturing the organic EL device of the present embodiment.

First, the method of manufacturing the organic EL device will be generally described.

An active matrix-driven TFT substrate is manufactured by a known method on the glass substrate 11. Next, a resin material for a planarizing layer 25 (lower resin layer), and a resin material for an upper insulating layer 22 (upper resin layer) having a high etching selectivity are patterned by a photo process. Next, openings (light-emission openings 26) are formed in the light-emitting region of the pixel 30. Also, between adjacent pixels 30, openings (removal openings 27) for removing the resin layer 25 (lower resin layer) below the lower electrode 21 (pixel electrode) are formed in a direction parallel to the longer side direction of the pixel 30.

Next, the substrate is soaked in a stripping solution, to which the upper insulating layer 22 is resistant. The stripping solution comes into contact with the lower resin layer 25 through the removal opening 27, and the lower resin layer 25 below the lower electrode 21 (pixel electrode) is removed by being dissolved in the stripping solution. Then, the substrate is washed and dried.

Next, the organic layer 23 is layered by a known method such as mask vapor deposition. Next, the upper electrode 24 (negative polarity) is formed by vapor deposition in areas including the display region and the common electrode contact region.

Next, the method of manufacturing the organic EL device will be specifically described. The steps (a) to (h) below correspond to FIGS. 3(a) to 3(h).

(a) First, a non-alkaline glass substrate 11 made by Corning Inc. is washed by a known method, and then, thin film transistors 12 (TFTs) and signal lines (not shown) are formed by a known method.

(b) Next, the interlayer insulating film 13 (first insulating layer) is formed by CVD or the like, and then, contact holes 15 are formed therein by dry etching in a photo etching process.

(c) A planarizing film (lower resin layer 25 (second)) is formed thereon by spin coating a resin material 3 μm in thickness (polyimide resin made by Toray Industries), and then pre-baking is performed for five minutes at 140° C. Then, by a known photo process, contact holes 15 for electrically connecting the lower electrode 21 (pixel electrode) to the TFT 12 are formed by a known photo process, and then, are baked in an air oven for one hour at 250° C.

(d) Then, ITO (indium tin oxide) (lower electrode 21) is formed over the entire surface by sputtering, and then patterned by a known photo etching process.

(e) Next, a resin material (acrylic resin made by JSR) is coated as the upper insulating layer 22 (upper resin layer) (third insulating layer) to a thickness of 2 μm, and then pre-baked for three minutes at 1140° C. Then, by a known photo process, an opening for the light-emitting region (light-emission opening 26) of the pixel 30, and an opening (removal opening 27) between pixels and parallel to the longer side direction of the pixels 30 are formed in the upper insulating layer 22. Also, the upper insulating layer 22 is formed to cover edge portions of the lower electrode 21.

(f) Next, the substrate is soaked for five minutes in a stripping solution (made by Hayashi Pure Chemical Ind., ltd; SPX) heated to 80° C., and the stripping solution enters the removal opening 27. Then, ultrasonic washing is performed using pure water, vapor washing is performed by isopropyl alcohol, and then the substrate is dried. As a result, the lower resin layer 25 is removed, and the gap 14 is formed.

(g) Next, an organic material (organic layer 23) for the organic EL element 20 is formed by mask formation by a known vapor deposition method to form an organic layer pattern. Prior to formation, the substrate is heated for one hour in an $N_2$ (nitrogen) oven at 200° C. and then heated for two hours at 200° C. in a vacuum chamber, to perform degassing. Next, the substrate, after having undergone the process of step (f), has formed thereon an NPB (N,N-di(naphthalene-1-yl)-N,N-diphenyl-benzidene) film at 30 mm as a hole injection layer and hole transport layer, and an $Alq_3$ (aluminato-tris-8-hydroxyquinolate) film at 50 nm as a light-emitting layer in succession.

(h) Then, as the metal layer for the upper electrode 24, lithium fluoride (LiF) is formed at a thickness of 5 nm, and aluminum (Al) is formed at a thickness of 100 nm successively by vapor deposition. Sealing of the organic EL element 20 is performed with the use of a cut glass made by leaving remaining a periphery of a sheet of glass in a frame shape, and a sealing resin.

The organic EL device 1 is made by the steps above.

The organic EL device 1 made by the steps above emits light outside by causing holes formed in the lower electrode 21 (positive polarity) and electrons occurring in the upper electrode 24 (negative polarity) to combine with each other in the light-emitting layer 232. In the organic EL device 1, the lower resin layer 25 between the lower electrode 21 and the interlayer insulating film 13 is removed, and a gap 14 (void) is formed between the lower electrode 21 and the interlayer insulating film 13, and thus, the occurrence of gases such as water vapor can be suppressed. Thus, it is possible to mitigate a decrease in luminance resulting from the formation of gases, and the reliability of the organic EL device can be increased. Also, in the organic EL device 1, an organic layer and a metal layer are formed on the substrate through the removal opening 27, but it is possible to prevent short-circuiting due to the presence of the gap 14, which is a few μm wide.

Figures 4, 5:
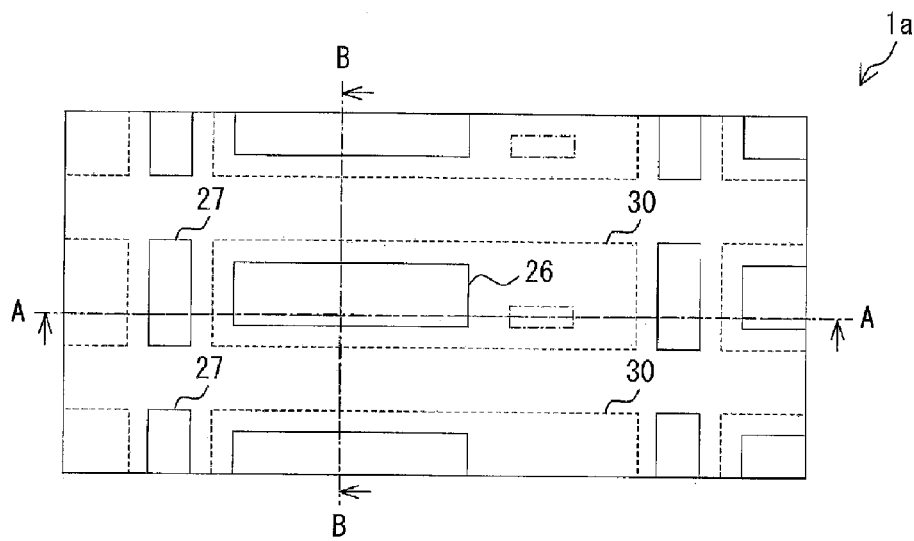
FIG. 4 shows a light-emitting state in an initial state of the organic EL device according to the present embodiment (prior to being placed in an oven), and a light-emitting state after the organic EL device has been removed from the oven after having been placed therein for 200 hours at a temperature of 85° C. and a humidity of 85%.
FIG. 5 is a plan view showing a schematic configuration of a main portion of an organic EL device according to Modification Example 1.

FIG. 4 shows an initial light-emitting state of an organic EL device 1 manufactured by the above steps (prior to the organic EL device being placed in the oven), and a light-emitting state of the organic EL device 1 after being removed from an oven where it has been held for 200 hours at a temperature of 85° C. and a humidity of 85%. FIG. 4 also shows a light-emitting state of a conventional organic EL device in which a resin layer is formed below the lower electrode (pixel electrode) for comparison with the light-emitting state of the organic EL device of the present invention.

As shown in FIG. 4, in the conventional organic EL device, the luminance has decreased after being placed in the oven, whereas in the organic EL device 1 of the present invention, the light-emitting state almost remains the same even after being placed in the oven. In other words, it was confirmed that it is possible to mitigate a decrease in luminance with the organic EL device 1 of the present invention.

Modification Example 1

Figure 6:
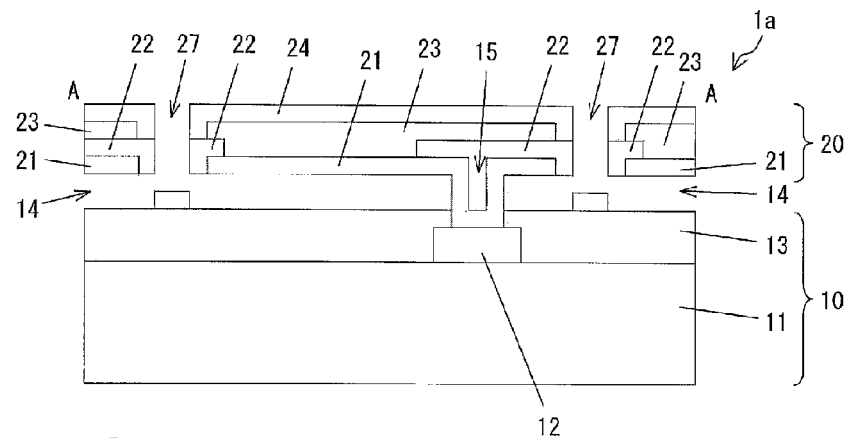
FIG. 6(a) is a cross-sectional view of FIG. 5 along the line A-A.
FIG. 6(b) is a cross-sectional view of FIG. 5 along the line B-B.
Figure 6:
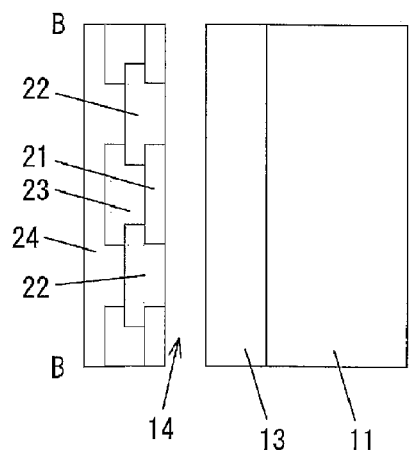

FIG. 5 is a plan view showing a schematic configuration of a main portion of an organic EL device of Modification Example 1, FIG. 6(a) is a cross-sectional view of FIG. 5 along the line A-A, and FIG. 6(b) is a cross-sectional view of FIG. 5 along the line B-B.

In the organic EL device 1 shown in FIGS. 1 and 2, the removal opening 27 is formed to be parallel to the longer side direction of the pixel 30, whereas in an organic EL device 1a of Modification Example 1, the removal opening 27 is formed to be parallel to the shorter side direction of the pixel 30. Effects similar to those attained by the above-mentioned organic EL device 1 can be attained with this configuration also. The configuration of the organic EL device 1 and that of the organic EL device 1a can be chosen based on the pixel arrangement.

Modification Example 2

Figure 7:
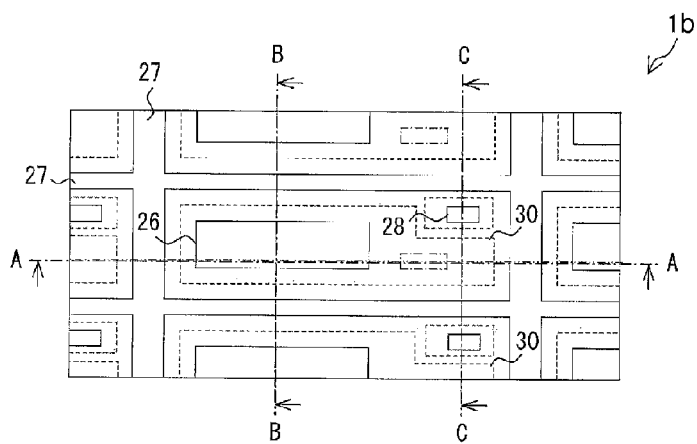
FIG. 7 is a plan view showing a schematic configuration of a main portion of an organic EL device according to Modification Example 2.
Figure 8:
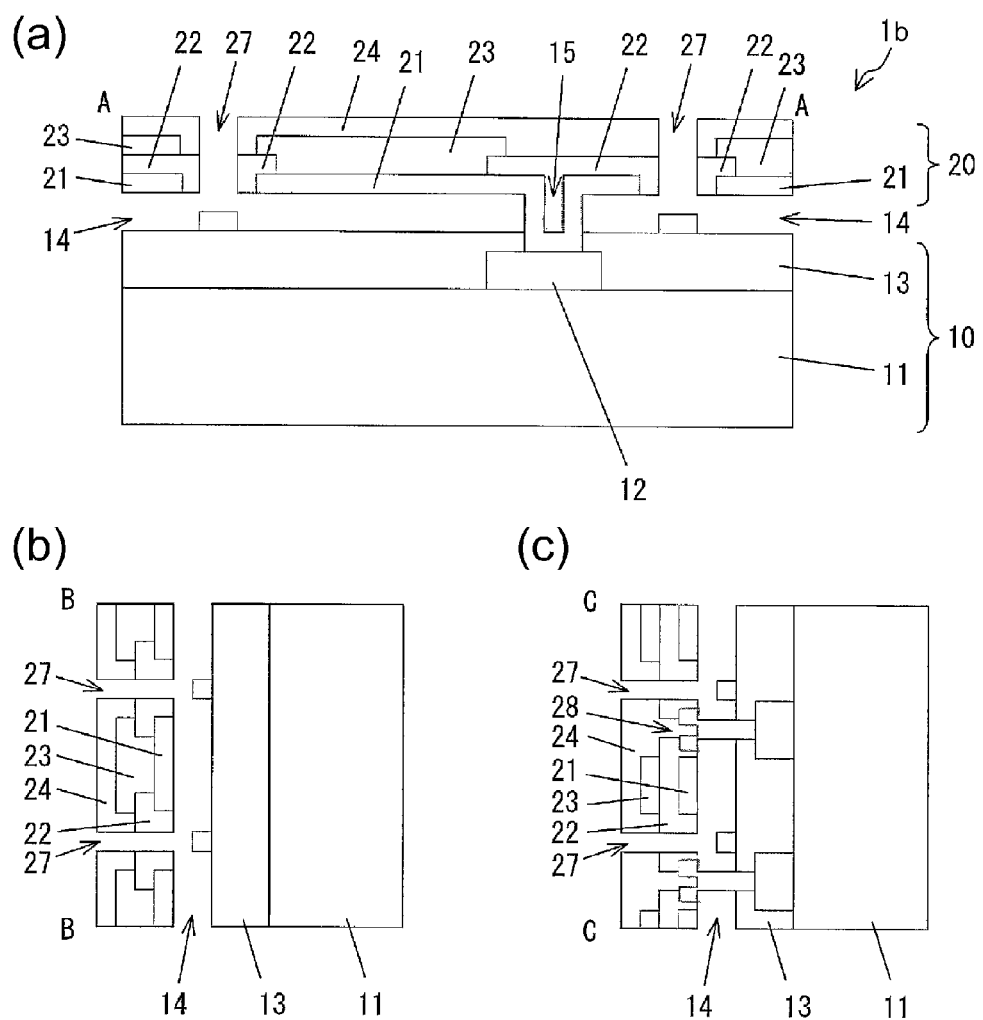
FIG. 8(a) is a cross-sectional view of FIG. 7 along the line A-A.
FIG. 8(b) is a cross-sectional view of FIG. 7 along the line B-B.
FIG. 8(c) is a cross-sectional view of FIG. 7 along the line C-C.
Figure 9:
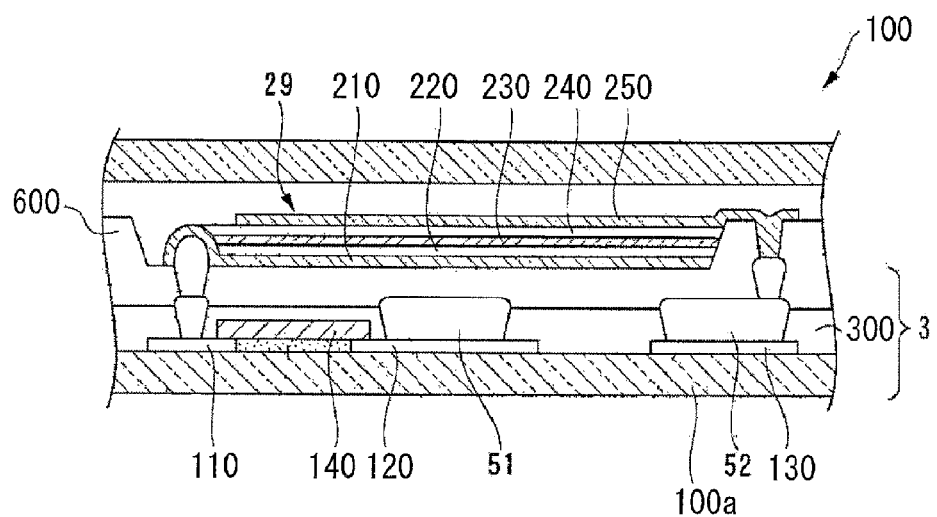
FIG. 9 is a cross-sectional view of a schematic configuration of an organic EL device in Patent Document 1.
Figure 10:
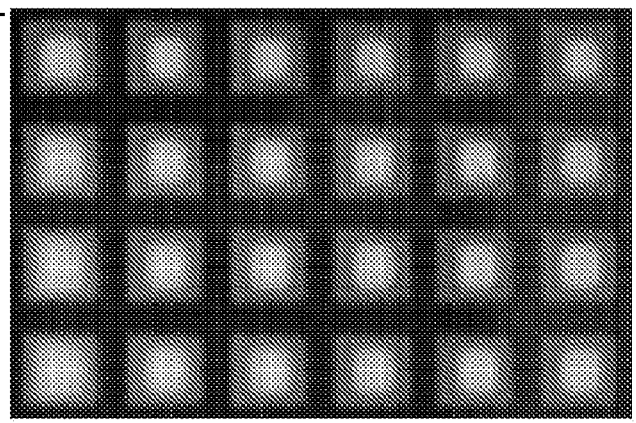
FIG. 10 shows a light-emitting state of a conventional organic EL device.

FIG. 7 is a plan view showing a schematic configuration of a main portion of an organic EL device of Modification Example 2, FIG. 8(a) is a cross-sectional view of FIG. 7 along the line A-A, FIG. 8(b) is a cross-sectional view of FIG. 7 along the line B-B, and FIG. 8(c) is a cross-sectional view of FIG. 7 along the line C-C.

In the organic EL device 1b of Modification Example 2, the removal opening 27 is formed on the entire periphery of the pixel 30, between adjacent pixels. Each pixel 30 is supported on the semiconductor substrate 10 by the lower electrode 21 in the contact hole 15. The common electrode pattern (upper electrode 24) of the organic EL element 20b is cut for each pixel, and thus, a contact hole 28 for common electrode connection is formed for each pixel. As shown in FIG. 8(b), the organic layer 23 is not formed in the contact hole 28 for common electrode connection, and the upper electrode 24 (metal layer) is formed to overlap the contact hole 28 for common electrode connection.

Summary of Embodiments

In order to solve the above-mentioned problem, an organic electroluminescent device according to the present invention is an organic electroluminescent device having a plurality of light-emitting regions, including:

a substrate;

an insulating layer formed on the substrate;

a plurality of lower electrodes formed over the insulating layer, respectively in the plurality of pixels each having a light-emitting region therein;

light-emitting layers formed respectively on the lower electrodes in the plurality of light-emitting regions; and an upper electrode formed on the light-emitting layers, a gap being formed between the insulating layer and the lower electrodes thereover.

According to the configuration above, a gap is formed between the insulating layer and the lower electrode, and thus, it is possible to suppress the formation of gases such as water vapor. Thus, it is possible to mitigate a decrease in luminance resulting from the formation of gases, and the reliability of the organic EL device can be increased.

In the organic electroluminescent device, it is preferable that another insulating layer be formed to cover edges of the lower electrodes.

With this configuration, it is possible to prevent short-circuiting between the lower electrode and the upper electrode.

The organic electroluminescent device can be configured such that thin film transistors are formed on the substrate and respectively connected to the lower electrodes.

With this configuration, as a result of active matrix driving from thin film transistors (TFTs), an image selection time can be set to be long, and it is possible to attain an organic EL panel having a high luminance and long life.

The organic electroluminescent device can be configured such that when viewing the organic electroluminescent device in a plan view, an opening is formed in a portion of the upper electrode in a region between adjacent pixels.

The organic electroluminescent device can be configured such that the opening is formed to be parallel to either a longer side direction or a shorter side direction of the pixels.

The organic electroluminescent device can be configured such that the opening is formed to surround a periphery of each of the pixels.

The organic electroluminescent device can be configured such that the light-emitting layer and the upper electrode are supported by the corresponding lower electrode that is connected to the thin film transistor through the gap.

In order to solve the above-mentioned problem, a method of manufacturing an organic electroluminescent device according to the present invention is a method of manufacturing organic electroluminescent device having a plurality of pixels each having a light-emitting region therein, including:

forming a first insulating layer on a substrate;

forming a second insulating layer on the first insulating layer;

forming a plurality of lower electrodes on the second insulating layer respectively in the plurality of light-emitting regions;

forming a third insulating layer on the lower electrodes;

removing the second insulating layer after forming the third insulating layer;

forming an organic layer on the third insulating layer after removing the second insulating layer; and forming an upper electrode on the organic layer.

According to the manufacturing method above, the second insulating layer between the first insulating layer and the lower electrode is removed, and a gap is formed between the first insulating layer and the lower electrode, and thus, the occurrence of gas such as water vapor can be mitigated. Thus, it is possible to mitigate a decrease in luminance resulting from the formation of gases, and the reliability of the organic EL device can be increased.

Also, in the manufacturing method above, after forming the lower electrode, the second insulating layer is removed, and thus, the lower electrode can be made equally planarized as the second insulating layer. Thus, it is possible to form an organic EL element with little unevenness in film thickness, and therefore, it is possible to attain improvements in display quality and a long life.

Also, in the manufacturing method above, after removing the second insulating layer, the organic EL element (organic layer and upper electrode) is formed, and thus, damage to the organic EL element due to the removal step can be prevented. Thus, the occurrence of dark spots, uneven luminance, and the like can be prevented.

It is preferable that the method of manufacturing an organic electroluminescent device further include: forming an opening the third insulating layer in a region between adjacent pixels after forming the third insulating layer, the second insulating layer being removed by pouring a stripping solution into the opening.

The method of manufacturing an organic electroluminescent device may further include forming openings in the third insulating layer in the light-emitting regions of the pixels after forming the third insulating layer.

In the method of manufacturing an organic electroluminescent device, the first insulating layer is an interlayer insulating film, and the second and third insulating layers are made of a resin material.

The present invention is not limited to the above-mentioned embodiments, and various modifications can be made without departing from the scope of the claims. That is, embodiments obtained by combining techniques modified without departing from the scope of the claims are also included in the technical scope of the present invention.

INDUSTRIAL APPLICABILITY

The present invention the present invention can be applied to various electronic devices such as displays for televisions, displays for mobile phones, and displays for personal computers.

DESCRIPTION OF REFERENCE CHARACTERS 1, 1a, 1b organic EL device
10 semiconductor substrate
11 glass substrate
12 TFT
13 interlayer insulating film (first insulating layer)
14 gap
15 contact hole
20 organic EL element
21 lower electrode (positive polarity, pixel electrode)
22 upper insulating layer (third insulating layer)
23 organic layer (hole transport layer, light-emitting layer)
24 upper electrode (negative polarity)
25 planarizing layer (lower insulating layer, lower resin layer, second insulating layer)
26 light-emission opening
27 removal opening

What is claimed is:

1. An organic electroluminescent device having a plurality of pixels each having a light-emitting region therein, comprising:
    a substrate;
    an insulating layer formed on the substrate;
    a plurality of lower electrodes formed over the insulating layer, respectively in the plurality of light-emitting regions;
    light-emitting layers formed respectively on the lower electrodes in the plurality of light-emitting regions; and
    an upper electrode formed on the light-emitting layers,
    wherein a void is formed between the insulating layer and the lower electrodes thereover, and
    wherein in plan view, an opening in the upper electrode is in a region between adjacent pixels, the opening being a through hole communicating with said void.

2. The organic electroluminescent device according to claim 1, further comprising: another insulating layer formed to cover edges of the lower electrodes.

3. The organic electroluminescent device according to claim 1, further comprising:
    thin film transistors formed on the substrate and respectively connected to the lower electrodes.

4. The organic electroluminescent device according to claim 1, wherein the opening is parallel to either a longer side direction or a shorter side direction of the pixels.

5. The organic electroluminescent device according to claim 1, wherein the opening surrounds a periphery of each of the pixels.

6. The organic electroluminescent device according to claim 3, wherein the light-emitting layer and the upper electrode are supported by the corresponding lower electrode that is connected to the thin film transistor through the void.

7. The organic electroluminescent device according to claim 2, further comprising:
    thin film transistors formed on the substrate and respectively connected to the lower electrodes.

8. The organic electroluminescent device according to claim 1, further comprising:
    an upper insulating layer covering edges of the lower electrodes,
    wherein, in plan view, another opening in a portion of the upper insulating layer is in a region between adjacent pixels, said another opening being another through hole connecting said opening in the upper electrode to said void.

* * * * *